United States Patent
Murtojärvi

(10) Patent No.: US 8,089,253 B2
(45) Date of Patent: Jan. 3, 2012

(54) POWER SUPPLIES FOR RF POWER AMPLIFIER

(75) Inventor: Simo Murtojärvi, Salo (FI)

(73) Assignee: Nokia Corporation, Espoo (FI)

( * ) Notice: Subject to any disclaimer, the term of this patent is extended or adjusted under 35 U.S.C. 154(b) by 540 days.

(21) Appl. No.: 12/072,621

(22) Filed: Feb. 27, 2008

(65) Prior Publication Data

US 2008/0278136 A1    Nov. 13, 2008

(30) Foreign Application Priority Data

May 7, 2007 (FI) .................................. 20075322

(51) Int. Cl.
*G05F 3/16* (2006.01)
*G05F 1/00* (2006.01)

(52) U.S. Cl. .................... 323/224; 323/265; 323/284

(58) Field of Classification Search .............. 323/222, 323/224, 265, 268, 282, 283, 284, 351
See application file for complete search history.

(56) References Cited

U.S. PATENT DOCUMENTS

| | | | | |
|---|---|---|---|---|
| 5,781,043 | A * | 7/1998 | Slemmer | 327/78 |
| 5,936,357 | A * | 8/1999 | Crouse et al. | 315/247 |
| 6,256,482 | B1 | 7/2001 | Raab | |
| 6,348,781 | B1 * | 2/2002 | Midya et al. | 323/224 |
| 6,798,177 | B1 * | 9/2004 | Liu et al. | 323/222 |
| 7,505,742 | B2 * | 3/2009 | Sharp et al. | 455/127.1 |
| 2004/0017251 | A1 * | 1/2004 | Mitzlaff | 330/10 |
| 2004/0227208 | A1 * | 11/2004 | Lee et al. | 257/510 |
| 2005/0093526 | A1 | 5/2005 | Notman | |
| 2006/0006850 | A1 * | 1/2006 | Inoue et al. | 323/265 |
| 2006/0128324 | A1 * | 6/2006 | Tan et al. | 455/127.1 |
| 2006/0255777 | A1 * | 11/2006 | Koertzen | 323/272 |
| 2007/0014382 | A1 * | 1/2007 | Shakeshaft et al. | 375/297 |
| 2007/0139975 | A1 * | 6/2007 | Yamauchi et al. | 363/16 |
| 2007/0182490 | A1 * | 8/2007 | Hau et al. | 330/297 |
| 2007/0298731 | A1 * | 12/2007 | Zolfaghari | 455/91 |
| 2008/0111529 | A1 * | 5/2008 | Shah et al. | 323/283 |
| 2008/0130330 | A1 * | 6/2008 | Tao | 363/74 |

FOREIGN PATENT DOCUMENTS

| | | |
|---|---|---|
| EP | 1381135 | 1/2004 |
| EP | 1755214 | 2/2007 |
| WO | WO 2006/085177 | 8/2006 |

* cited by examiner

*Primary Examiner* — Adolf Berhane
*Assistant Examiner* — Jeffrey Gblende
(74) *Attorney, Agent, or Firm* — Hollingsworth & Funk, LLC

(57) ABSTRACT

Switched-mode power supplies (SMPSs) and their control methods for radio frequency (RF) power amplifiers in battery-powered wireless transmitter devices involve a Boost-type SMPS and a Buck-type SMPS in cascade connection which are controlled so that high efficiency is maintained for various loads and transmission power levels. The Boost SMPS and the Buck SMPS can be controlled based on the mode of operation of the transmitter, such as the actual battery voltage, the needed output power, the selected frequency band, the selected RF power amplifier (PA), the selected modulation method of the transmission signal, and/or the selected PA voltage control method, such as the envelope elimination and restoration (EER) technique, the envelope tracking (ET) technique, or the power-level tracking (PT) technique.

48 Claims, 5 Drawing Sheets

POWER SUPPLIES FOR RF POWER AMPLIFIER

FIELD OF THE INVENTION

The present invention relates to switched-mode power supplies, and more specifically to switched-mode power supplies and their control methods for radio frequency (RF) power amplifiers in battery-powered wireless transmitter devices.

BACKGROUND OF THE INVENTION

Energy-efficient radio frequency (RF) power amplifiers (PA) are critical components in mobile, battery-operated wireless communication devices, e.g. mobile phones, personal digital assistants (PDA), etc., because they determine a significant portion of the total power consumption of such devices. Batteries with low supply voltage, typically about 3V, are employed in the portable devices. It has been possible to design a PA for the 3V battery voltage even if the efficiency already has dropped a bit. In order to get high efficiency from a PA, a switching-mode power supply (SMPS), often referred to as a Boost converter or a step-up converter is needed to up-convert the battery voltage to a value higher than the maximum battery voltage. With this approach, the needed output transmission power can be easily obtained from the PA, but the efficiency for small transmission power levels is poor. To improve efficiency also at the small transmission power levels, the supply voltage of the PA must be lowered. This is not possible with a Boost-type power supply but another type of switching-mode power supply (often referred to as a Buck converter, or a step-down converter) is provided to down-convert the raised battery voltage to the level needed for actual transmission power level. If the two converters are cascaded, the efficiency at low transmission power levels suffers from the cascaded converters and the high voltage between them.

Some RF PA applications with a switching-mode power supply (SMPS) use a dynamic biasing PA, such as the envelope elimination and restoration (EER) technique, to achieve high-efficiency, linear power amplification. In the EER, the phase and envelope information are extracted from the original modulated signal. A constant envelope signal containing the phase information is amplified using an RF PA. Since the phase information has a constant envelope, the PA can be highly overdriven to achieve high efficiency. The envelope information is fed into the power supply circuit to modulate the supply voltage of the RF PA (e.g. drain or collector voltage) and thereby superimpose the envelope variation. By changing the supply voltage, the output waveform will be shaped and the overall amplification can be linear. There are also simplified versions of the EER, such as the envelope tracking (ET) technique. In the ET technique, the input signal to the RF amplifier contains both the phase information and the amplitude information, and only the envelope information is extracted for the switching power supply. The RF PA is operated in the linear region and its supply voltage is changed according to the extracted envelope information. The supply voltage is varied with sufficient headroom to minimize distortion. Examples of transmitter architectures employing EER technique are disclosed in U.S. Pat. No. 6,256,482 and WO2006/085177. A still further version is power-level tracking (PT) in which a switching-mode power supply tracks only the slow-varying average power level, instead of the fast-varying envelope, and modulates the drain or collector voltage of a linear PA.

So-called Buck-Boost converters also exist. An example of a Buck-Boost converter is disclosed in U.S. Pat. No. 6,348,781. The Buck-Boost converters are designed to change mode from Buck to Boost automatically to provide a supply voltage that ensures good efficiency of an RF PA at any specific transmission power level. No cascading is needed. However, in applications that use the envelope elimination and restoration (EER) technique, a very tightly controlled frequency and group delay response is needed. With a Buck-Boost switching-mode power supply, the output voltage range where the mode changes is quite critical, and distortion occurs. Also, in the Boost mode of operation it is difficult to keep the response unaffected. Buck-Boost converters are good choices for power level tracking where the frequency and group delay requirements are loose.

The problems regarding efficiency are becoming more significant with the battery technology, e.g. lithium battery technology, lowering the cut of voltage from the present range, e.g. 3V, to about 2.5V or lower. As a consequence, a transmission (TX) power amplifier becomes very inefficient and variation in its performance increases, if it is designed for 2.3V supply voltage, for example.

A SUMMARY OF THE INVENTION

Some aspects of the present invention are disclosed in the attached independent claims. Various embodiments of the invention are disclosed in the dependent claims.

According to an aspect of the invention, a control method comprises measuring a battery voltage inputted to a cascade connection of a boost-type switched-mode power supply and a buck-type switched-mode power supply providing a supply voltage to a radio frequency power amplifier;

comparing the measured battery voltage with a threshold corresponding to an input supply voltage which is needed for the buck-type switched-mode power supply;

bypassing the boost-type switched-mode power supply and coupling the battery voltage directly to the buck-type switched-mode power supply, if the measured battery voltage exceeds the needed input supply voltage;

controlling the boost-type switched-mode power supply to raise the battery voltage to at least the needed input supply voltage, if the measured battery voltage is below the needed input supply voltage;

controlling the buck-type switched-mode power supply to operate in one of at least two section modes according to one or more of the following: a mode of operation of the power amplifier, a frequency band of the power amplifier, a modulation method, and a transmission power of the power amplifier.

According to a further aspect of the invention, an apparatus comprises at least one radio frequency power amplifier;

a boost-type switched-mode power supply having an input for a battery voltage from a battery;

a buck-type switched-mode power supply connected in cascade with the boost-type switched-mode power supply and having a supply voltage output for the radio frequency power amplifier, a bypass switch controllable to bypass the boost-type switched-mode power supply and to couple the battery voltage directly to the buck-type switched-mode power supply, if the battery voltage exceeds a threshold corresponding to an input supply voltage which is needed for the buck-type switched-mode power supply;

the boost-type switched-mode power supply being controllable to raise the battery voltage to at least the needed input supply voltage, if the battery voltage is below the threshold; and the buck-type switched-mode power supply comprising at least two section modes selectable according to one or more of the following: a mode of operation of the power amplifier, a frequency band of the power amplifier, a modulation method, and a transmission power of the power amplifier.

According to a further aspect of the invention, a control method comprises providing a cascade connection of a boost-type switched-mode power supply and a buck-type switched-mode power supply to provide a supply voltage to a radio frequency power amplifier from a battery voltage;

controlling the boost-type switched-mode power supply to raise the battery voltage to at least an input supply voltage which is needed for the buck-type switched-mode power supply;

controlling the buck-type switched-mode power supply to operate in one of at least two section modes according to one or more of the following: a mode of operation of the power amplifier, a frequency band of the power amplifier, a modulation method, and a transmission power of the power amplifier.

According to a further aspect of the invention, a control method comprises providing a cascade connection of a boost-type switched-mode power supply and a buck-type switched-mode power supply to provide a supply voltage to a radio frequency power amplifier from a battery voltage;

controlling the boost-type switched-mode power supply to raise the battery voltage to at least an input supply voltage which is needed for the buck-type switched-mode power supply;

controlling the buck-type switched-mode power supply to operate at a higher switching frequency, when the power amplifier operates in an envelope elimination and restoration (EER) mode or in an envelope tracking (ET) mode, and to operate at a lower switching frequency, when the power amplifier operates in a linear mode.

Still another aspect of the invention is a computer program embodied on a computer readable medium, said computer program comprising a program code for controlling a processor to execute control methods according to various embodiments of the invention.

Still another aspect of the invention is a controller comprising means for embodying control methods according to various embodiments of the invention.

BRIEF DESCRIPTION OF THE DRAWINGS

In the following the invention will be described in greater detail by means of exemplary embodiments with reference to the attached drawings, in which.

DETAILED DESCRIPTION OF THE INVENTION

Figure 1:
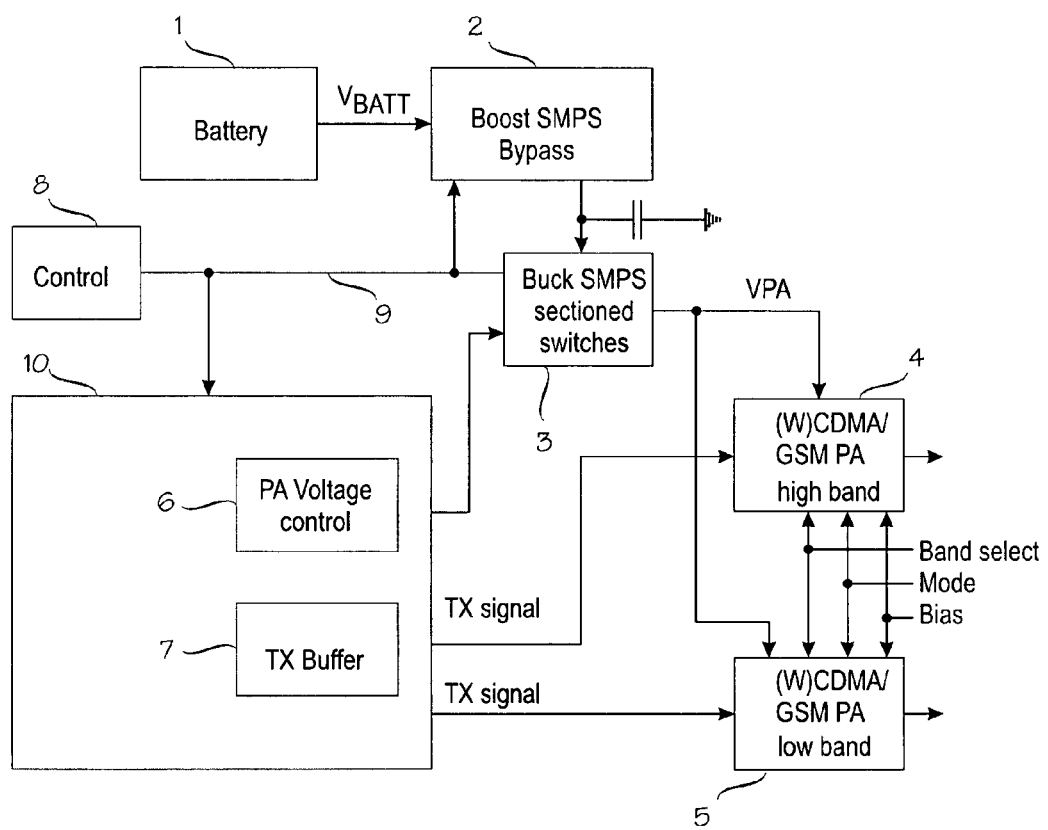
FIG. 1 is a block diagram illustrating an example of a transmitter according to an embodiment of the present invention.

Referring to FIG. 1, a block diagram of an exemplary RF transmitter (TX) circuitry is shown in which a supply voltage is provided from a battery 1 to power amplifiers (PA) 4, 5 through cascaded Boost and Buck switched-mode power supplies (SMPS) 2, 3.

A battery 1 provides a battery voltage $V_{batt}$ to a Boost-type switched mode power supply 2 according to an embodiment of the invention. The battery may be any type of battery suitable for portable devices, such as a lithium cell battery or a nickel cadmium battery. The battery voltage $V_{batt}$ may have any low voltage value depending on the application and the battery technology selected. A typical battery voltage may be about 3 Volts or lower, or even 2.5 Volts or lower.

The Boost switched-mode power supply 2 up-converts from the battery voltage $V_{batt}$ a supply voltage $V_2$ with a raised voltage level to a Buck-type switched-mode power supply 3. The Boost switched-mode power supply may also include a bypass function that bypasses the battery voltage $V_{batt}$ to form the supply voltage $V_2$ to the Buck-type switched-mode power supply 3 without boosting. The Boost switched-mode power supply 2 may also include sectioned transistor switches as will be described below. A boost condensator C1 filters high-frequency interference from the boosted voltage $V_2$.

The Buck-type switched-mode power supply 3 down-converts from the supply voltage $V_2$ a supply voltage $V_1$ for the RF power amplifiers (PA) 4 and 5. The Buck-type switched-mode power supply 3 may also include sectioned transistor switches as will be described below. The Buck SMPS 3 may provide a biasing control for the PAs 4 and 5 by modulating their supply voltage $V_1$ connected to the collectors of the PAs 4 and 5. To that purpose, a PA supply voltage control unit 6 in the transmitter circuitry may provide a PA voltage control signal to the Buck SMPS 3. For example, for the envelope elimination and restoration (EER) technique, envelope tracking (ET) technique, or power-level tracking (PT), the PA voltage control signal from the control unit 6 may represent envelope information derived from the modulated signal, so that the voltage control signal causes the Buck SMPS 3 to modulate the supply voltage $V_1$. In an embodiment, the Buck SMPS 3 may be controlled directly with duty cycle information (command) when the Buck SMPS 3 has an internal duty cycle generator. In another embodiment, a control signal required with the wanted duty cycle is sent to the input of a switch driver in the Buck SMPS 3.

Nowadays, mobile communication devices are often multimode and multiband devices supporting two or more frequency bands and modulation formats (for example, GSM, EDGE, CDMA, WCDMA). It is logical to use as few RF power amplifiers as possible but typically at least a low frequency band (such as 900 MHz band for GSM/EDGE/WCDMA) and a high frequency band (such as 1800/1900 MHz band for GSM/EDGE/WCDMA) use different RF power amplifiers even if the amplifiers were implemented inside the same RF module and even on the same chip. In the embodiment shown in FIG. 1, there are two RF power amplifiers (PAs), the RF PA 4 for a high frequency band (e.g.

1800/1900 MHz) of one or more systems (such as GSM, CDMA, WCDMA), and the RF PA 5 for a low frequency band (such as 900 MHz) of one or more systems (such as GSM, CDMA, WCDMA). However, the present invention is not intended to be restricted to this number of power amplifiers but all bands may be implemented by means of one power amplifier, or there may be more power amplifiers with dedicated frequency bands. It should also be appreciated that the mobile communication systems and frequency bands mentioned are only examples, and the present invention can be applied to any mobile communication systems and frequency bands.

A power amplifier may have several different modes of operation, for example a linear mode for the envelope tracking (ET) and power tracking (PT) operation, and a compressed mode for the EER operation. The needed transmission output powers are different for different cellular systems and frequency bands. For instance, for the GSM900 system the needed maximum output power may be 2 W or 33 dBm, for the GSM1800 system the needed maximum output power may be 1 W (30 dBm), and for WCDMA on both bands the needed maximum output power may 24 dBm on average. If the output matching of RF PAs is fixed (could also be switchable), the RF PAs are usually designed so that the maximum wanted power is obtained with a certain collector voltage, for example 4.5V. When lower power is needed, the collector voltage can be reduced and this may be achieved with a buck converter. Also, the needed amount of current with maximum output power is less for the high frequency band (1 W versus 2 W in the example above). Because the same switched-mode power supplies feed the PAs operating in different frequency bands and thereby with different transmission powers, the SMPSs need to be designed for the heaviest load (in the example above, to feed the GSM900 band requires a maximum power of 2 W). When another PA or another modulation or a lower output power is used, the efficiency of the SMPSs is not optimum.

According to embodiments of the invention, the Buck-type SMPS or the Boost-type SMPS or both may be configured to be sectioned SMPSs. In other words, the transistor switches may be implemented with parallel transistors, instead of single transistors, so that it is possible to selectively use some or all of the parallel transistors according to the load at each specific moment and thus reduce the capacitive switching losses.

Figure 2:
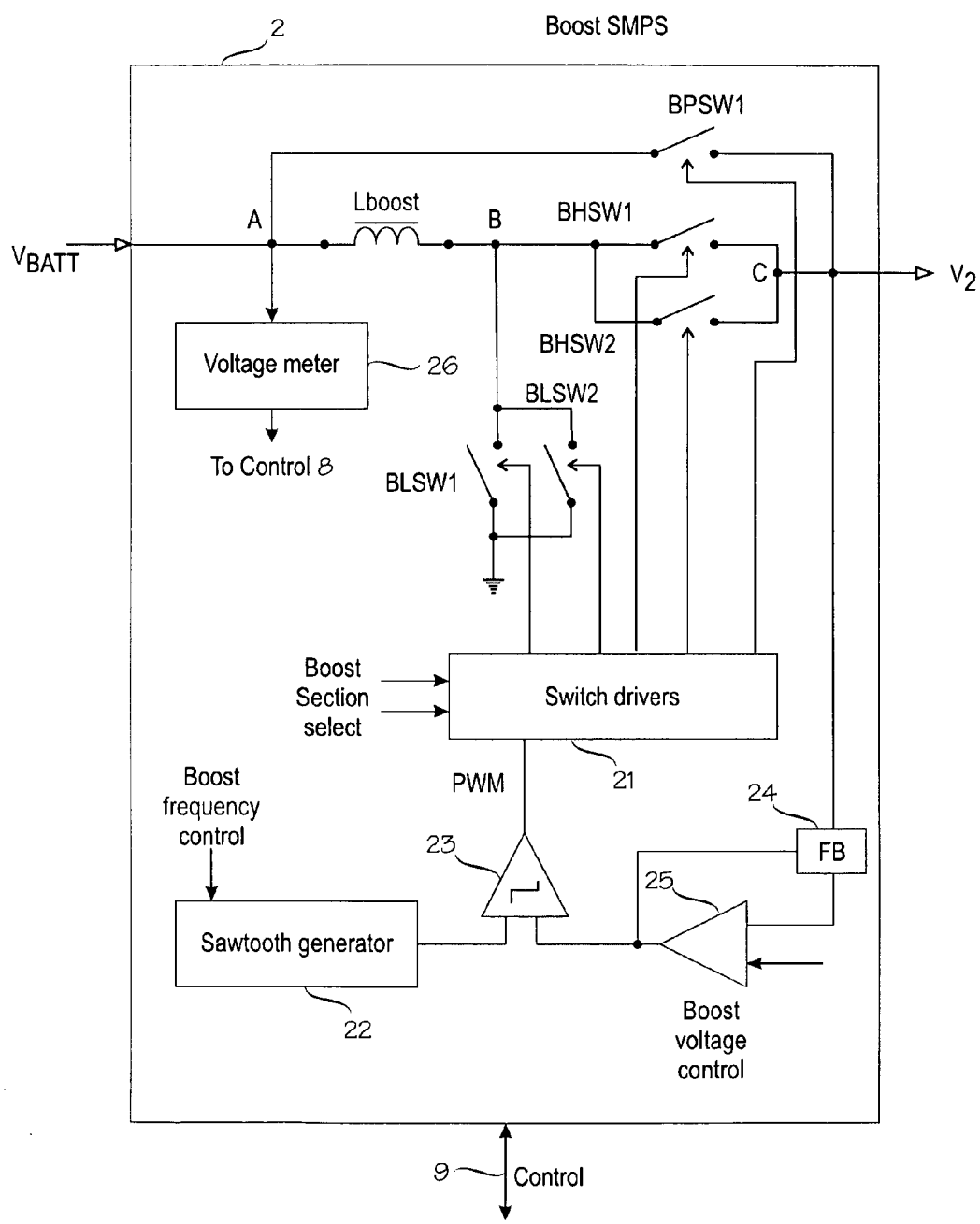
FIG. 2 is a schematic diagram illustrating an example of a boost-type switched-mode power supply according an embodiment of the invention.

An example schematic diagram of a sectioned bypass Boost switched-mode power supply (SMPS) according to an embodiment of the invention is shown in FIG. 2. The battery voltage $V_{BATT}$ from the battery 1 at an input node A is coupled to one end of a boost inductor $L_{boost}$, the second end of which is coupled to a circuit node B. A voltage meter 26 may be provided to measure the battery voltage and to forward the measurement result to a control unit 8 via a control bus/line 9. Parallel high-side switches BHSW1 and BHSW2 are coupled between the node B and an output node C, and parallel low-side switches BLSW1 and BLSW2 are connected between the node B and a ground potential, for example. A bypass switch BPSW1 may further be connected between the input node A and the output node C to selectively bypass the boost inductor $L_{boost}$ and the high-side switches BHSW1 and BHSW2, and thereby to couple the battery voltage $V_{BATT}$ directly to the Buck SMPS 3. The control inputs of switches BHSW1, BHSW2, BLSW1, BLSW2 and BPSW1 are controlled by respective control signals from a switch driver 21. Depending on the Boost section mode selected according to a boost section select control input, the switch driver 21 turns selected boost switches BHSW1, BHSW2, BLSW1 and BLSW2 ON (conductive) and OFF (non-conductive) under the control of a pulse width modulated (PWM) signal having a predetermined switching frequency. The switching frequency is generated by a switching frequency generator, such as a sawtooth waveform generator 22 in FIG. 2. The switching frequency may be set by a boost frequency control signal. The sawtooth waveform from the generator 22 may be applied to a first input of a comparator 23, such as a Smith trigger. The voltage $V_2$ at the output node C is coupled via a feedback network 24 to a first input of a further comparator 25. A boost voltage control signal that determines the desired boost voltage $V_2$ is applied to a second input of the comparator 25. An output voltage of the comparator 25 is thus proportional to the difference between the desired boost voltage and the actual output voltage $V_2$, and it is applied to a second input of a comparator 23. The state of the output from the comparator 23 changes each time the level of the sawtooth waveform exceeds the output voltage from the comparator 25. Thereby a PWM signal is provided whose frequency is set by the frequency of the sawtooth signal and whose duty cycle is set by the difference between the desired and actual boost voltage $V_2$. If the bypass switch BPSW1 is turned on, and the Boost SMPS is bypassed, all boost switches BHSW1, BHSW2, BLSW1 and BLSW2 may be turned off, or the high side switches BHSW1 and BHSW2 may be kept on in order to decrease the total resistance from battery to output because the current flows through the high side switches and the bypass switch. The latter arrangement allows to size the bypass switch smaller and thereby saves chip area in integrated implementations. The boost section select, the boost frequency control, and the boost voltage control may be obtained through the control bus/line 9 from a transmitter control unit 8. It should be appreciated that this is only one example of many possible ways to implement the switch drive and control.

In an embodiment of the invention, the Boost SMPS 2 may be configured to have three section modes. In the first section mode, all switches BHSW1, BHSW2, BLSW1 and BLSW2 are selected. In the second section mode, the switches BHSW1 and BLSW1 are selected. In the third section mode, the switches BHSW2 and BLSW2 are selected. One example of possible sizing of switches BHSW1, BHSW2, BLSW1 and BLSW2, when field effect transistors (FETs) are used, could be as follows. If the needed FET size for maximum current is W=21 mm (wherein W is a channel width whose value depends on a needed switch resistance), this maximum size could be split between two parallel FETs, so that a first FET (e.g. BHSW1 and BLSW1) has a size W=14 mm and a second FET (e.g. BHSW2 and BLSW2) has a size W=7 mm. Thus, in the first section mode, when both parallel switches BHSW1 and BHSW2, or BLSW1 and BLSW2, respectively, are activated, the total effective width of the parallel switches is 21 mm. In the second section mode, when only the bigger switch, BHSW1 and BLSW1, is selected in each pair of parallel switches, the active size is 14 mm. Similarly, in the third section mode, when only the smaller switch, BHSW2 and BLSW2, is selected in each pair of parallel switches, the active size is 7 mm. As a result, the driving losses are reduced to two-thirds in the second section mode and to one-third in the third section mode in relation to the first section mode, i.e. the full load. It should be appreciated that the invention is not intended to be restricted to the sizing presented in the above example but the sizing can be freely chosen for each application, depending on the number of parallel switches, the number of desired section modes, the type and number of different loads, for example.

It should also be appreciated that the number of different section modes can be freely chosen for each application. In an embodiment of the invention, there is no sectioning of the boost switches at all, and bypass switching is implemented. In an embodiment of the invention, the Boost SMPS 2 shown in FIG. 2 may be configured to have two section modes. With the exemplary sizing described above, in the first section mode, all switches BHSW1, BHSW2, BLSW1 and BLSW2 may be selected, and in the second section mode, the switches BHSW1 and BLSW1 or the switches BHSW2 and BLSW2 may be selected. As another example, if the switches BHSW1 and BLSW1 are sized for a full load (e.g. W=21 mm) and the switches BHSW2 and BLSW2 are sized for a half load (e.g. W=10 mm), BHSW1 and BLSW1 may be selected in the first section mode and BHSW2 and BLSW2 may be selected in the second section mode. In most applications, two or three section modes provide a sufficient improvement in the performance in comparison with the complexity and cost of the additional control.

Figure 3:
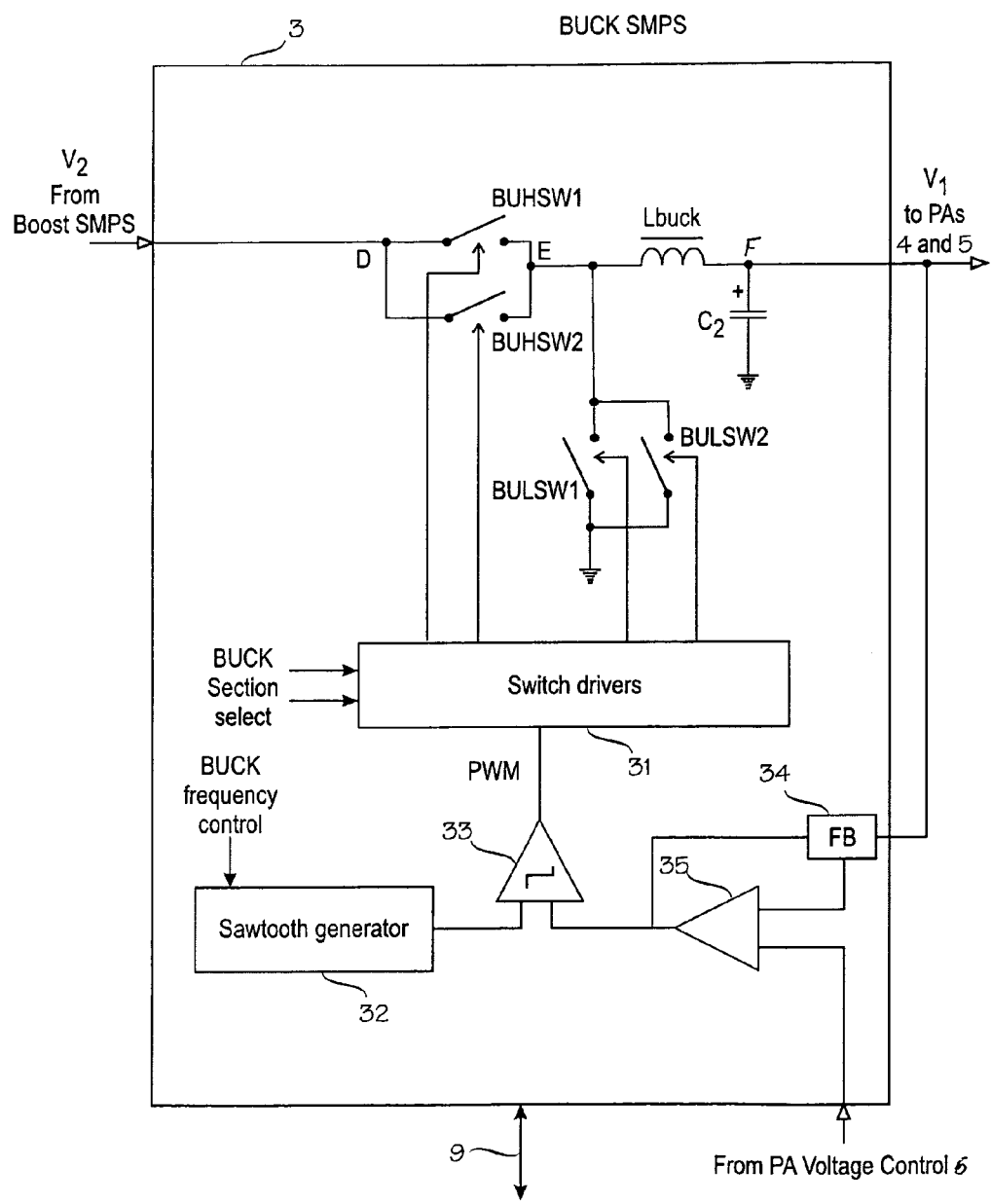
FIG. 3 is a schematic diagram illustrating an example of a buck-type switched-mode power supply according an embodiment of the invention.

An example schematic diagram of a sectioned Buck switched-mode power supply (SMPS) according to an embodiment of the invention is shown in FIG. 3. The voltage $V_2$ (i.e. the boosted voltage or the bypassed battery voltage $V_{BATT}$) from the Boost SMPS 2 is inputted to the Buck SMPS 3 at an input node D. Parallel high-side switches BUHSW1 and BUHSW2 are coupled between the node D and a node E, and parallel low-side switches BULSW1 and BULSW2 are connected between the node E and a ground potential, for example. A buck inductor $L_{buck}$ is connected between the node E and the output node F. A buck capacitor C2 is connected between the node F and the ground potential. The control inputs of switches BUHSW1, BUHSW2, BULSW1 and BULSW2 are controlled by respective control signals from a switch driver 31. Depending on the Buck section mode selected according to a buck section select control input, the switch driver 31 turns selected ones of the boost switches BUHSW1, BUHSW2, BULSW1 and BULSW2 ON (conductive) and OFF (non-conductive) under the control of a pulse width modulated (PWM) signal having a predetermined switching frequency. The switching frequency is generated by a switching frequency generator, such as a sawtooth waveform generator 32. The switching frequency may be set by a buck frequency control signal. The sawtooth waveform from the generator 32 may be applied to a first input of a comparator 33, such as a Smith trigger. The voltage $V_1$ at the output node F is coupled via a feedback network 34 to a first input of a further comparator 35. An envelope or voltage control signal from the PA voltage control circuit 6 may be applied to a second input of the comparator 35. An output voltage of the comparator 35 is thus proportional to the difference between the envelope information (representing the desired buck voltage) and the actual output voltage $V_1$, and it is applied to a second input of the comparator 33. The state of the output from the comparator 33 changes each time the level of the sawtooth waveform exceeds the output voltage from the comparator 35. Thereby a PWM signal is provided whose frequency is set by the frequency of the sawtooth signal and whose duty cycle is set by the difference between the desired and actual buck voltage $V_1$. The buck section select and the buck frequency control may be obtained through the control bus/line 9 from a transmitter control unit 8. It should be appreciated that this is only one example of many possible ways to implement the switch drive and control.

In an embodiment of the invention, the Buck SMPS 3 may be configured to have three section modes. In the first section mode, all switches BUHSW1, BUHSW2, BULSW1 and BULSW2 are selected. In the second section mode, the switches BUHSW1 and BULSW1 are selected. In the third section mode, the switches BUHSW2 and BULSW2 are selected. One example of possible sizing of switches BUHSW1, BUHSW2, BULSW1 and BULSW2 is similar to that described in connection with the Boost SMPS 2 in FIG. 2. However, it should be appreciated that the invention is not intended to be restricted to the sizing presented in that example but the sizing can be freely chosen for each application, depending on the number of parallel switches, the number of desired section modes, the type and number of different loads, for example.

It should also be appreciated that the number of different section modes can be freely chosen for each application, in a manner similar to that described in connection with the Boost SMPS 2 in FIG. 2. Thus, in an embodiment of the invention, the Buck SMPS 3 shown in FIG. 3 may be configured to have two section modes. With the exemplary sizing described above, in the first section mode, all switches BUHSW1, BUHSW2, BULSW1 and BULSW2 may be selected, and in the second section mode, the switches BUHSW1 and BULSW1 or the switches BUHSW2 and BULSW2 may be selected. As another example, if the switches BUHSW1 and BULSW1 are sized for a full load (e.g. W=21 mm) and the switches BUHSW2 and BULSW2 are sized for a half load (e.g. W=10 mm), BUHSW1 and BULSW1 may be selected in the first section mode and BUHSW2 and BULSW2 may be selected in the second section mode. In most applications, two or three section modes provide a sufficient improvement in the performance in comparison with the complexity and cost of the additional control.

The frequency control allows changing the switching frequency of the Boost SMPS 2 and the Buck SMPS 3 for different modes. Some modes, such as those using EER, ET or PT require relatively high switching frequency in order to achieve the required accuracy. A high switching frequency decreases the efficiency with increasing switching losses (parasitic capacitances of a switching stage and its control gates are charged and discharged at the switching frequency). Therefore, efficiency can be improved by lowering the switching frequency in the modes where it is possible. In an embodiment of the invention, the frequency control may also include a dithering mode where the frequency is changed randomly from cycle to cycle. Dithering spreads the switching frequency spuriously over a wider band and thus reduces the average spur power density.

According to embodiments of the invention, the Boost SMPS 2 and the Buck SMPS 3 in cascade connection are controlled so that high efficiency is maintained for various loads and transmission power levels. The Boost SMPS 2 and the Buck SMPS 3 may be controlled based on the mode of operation of the transmitter, such as the actual battery voltage, the needed output power, the selected frequency band, the selected RF power amplifier (PA), the selected modulation method of the transmission signal, and/or the selected PA voltage control method, such as the envelope elimination and restoration (EER) technique, the envelope tracking (ET) technique, or the power-level tracking (PT).

For example, in an embodiment of the invention, because the switching losses depend directly on the voltage range over which the signal is swinging, the Boost SMPS 2 may be switched off and put into a bypass mode when the battery voltage $V_{BATT}$ exceeds by a certain amount the actual needed collector voltage of a PA, so as to decrease the switching losses and to enhance efficiency.

The supply currents taken by a PA may be different for the same collector voltage depending on the frequency band and mode of operation selected. For example, the highest supply currents are needed for the GSM900 transmission at the maximum power level, and thereby the first section mode enabling the high currents may be selected in the Boost SMPS 2 and/or Buck SMPS 3. For WCDMA, for example, the maximum currents and needed voltages are much less. Therefore, with the nominal battery voltage the Boost SMPS 2 may be bypassed for all WCDMA power levels and/or the second or third section mode may be selected in the Buck SMPS 3 in order to enhance efficiency.

As a further example, according to an embodiment of the invention, if the WCDMA PA collector voltage is controlled according to the power level (the PT technique), then the switching frequency of Buck SMPS 3 can be reduced to decrease the switching losses, because there is no need for fast changes in voltage and the PA is also less sensitive to the ripple in collector voltage when used in the linear mode of operation, such as the PT. On the other hand, if the GSM PA collector voltage is controlled according to the EER or the ET technique, higher accuracy and a higher switching frequency of the Buck SMPS 3 is required.

In the following, examples of the operation of the transmitter and the control of the Boost and Buck SMPSs according to embodiments of the invention are described.

Control of the transmitter may be provided from a transmitter control unit 8 that may be implemented by a control unit controlling the whole operation of a wireless communication device, such a cellular telephone. The control unit 8 may select a mode of operation for a multimode multiband wireless communication device and configure the RF power amplifiers 4 and 5 as well as the transmitter front stages 10 accordingly.

The switches BHSW1, BHSW2, BLSW1 and BLSW2 of the Boost SMPS 2 as well as the switches BUHSW1, BUHSW2, BULSW1 and BULSW2 of the Buck SMPS 3 are typically enabled only during the transmission of radio bursts, and disabled otherwise. Consequently, the RF PAs 4 and 5 may be energized only during the radio bursts.

When a transmitter (TX) is needed to start, the first step is to start the Boost SMPS 2. Then the Buck SMPS 3 is started and needed control voltage from PA voltage control unit 6 is set. The PA voltage control unit 6 may include a digital-to-analog converter (DAC) for converting digital voltage control values into an analog signal. For example, the digital voltage control value that is written to the DAC may range from 0 to 2048, whereby the value 2048 may give an output voltage of 4.7 V from the Buck SMPS 3. Alternatively, it is also possible to control the buck SMPS 3 directly with duty cycle information (command), if the buck SMPS 3 has an internal duty cycle generator, or send an input signal required with the wanted duty cycle (e.g. a signal similar to the PWM signal in FIG. 3) to the input of switch driver 31.

The control of the Boost and Buck SMPSs according to a battery voltage $V_{BATT}$, the selected transmission power level, the selected PA (the selected frequency band) and/or the selected mode may be as described in the following with reference to FIGS. 4 and 5.

Control of the Boost SMPS 2

Figure 4:
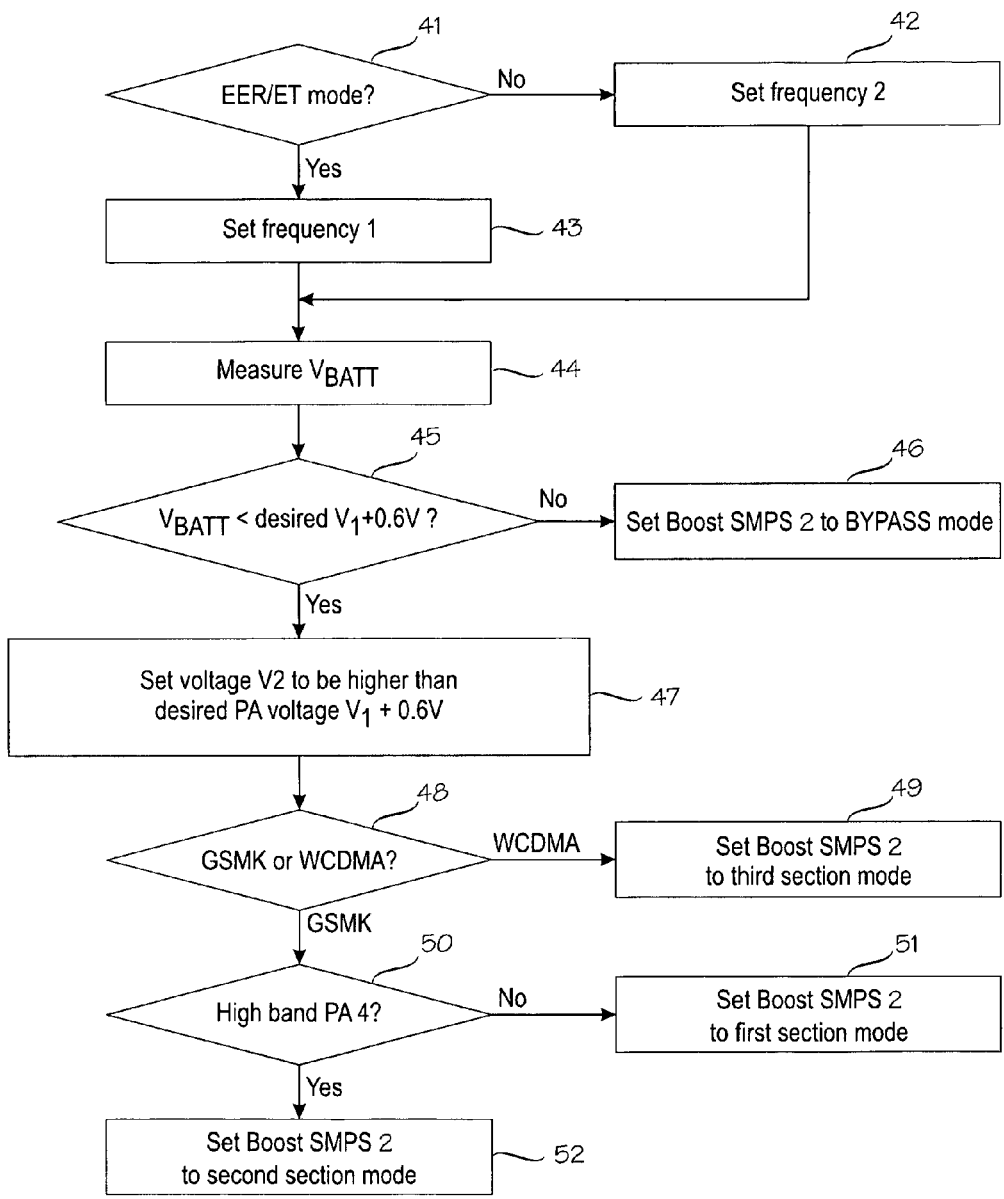
FIG. 4 is a flow diagram illustrating an example of a control algorithm for controlling a boost-type switched-mode power supply in accordance with an embodiment of the invention.

Referring to FIG. 4, it is first checked whether the transmitter operates in the EER or ET mode in step 41. If the transmitter operates in the EER or ET mode, the boost switching frequency is set to a frequency 1 (e.g. 8 MHz) by means of the boost frequency control signal applied to the generator 22, step 43. In an embodiment of the invention, different buck switching frequencies 1 and 1' may be set for EER and ET, respectively. A lower frequency 1' may be used in the ET mode because it is more linear than EER. However, fast envelope tracking is easier achieved with a higher switching frequency, such as that used for EER. If the transmitter does not operate in the EER or ET mode, the boost switching frequency is set to a frequency 2 (e.g. 5 MHz) in step 42.

The battery voltage $V_{BATT}$ is measured during transmitting burst or shortly before the start of the transmitter TX, step 44. In step 45, it is checked whether the measured $V_{BATT}$ is lower than the desired PA supply voltage $V_1$ (e.g. power scale*4.7V/2048) plus preset headroom (e.g. 0.6 V) needed by the Buck SMPS 3 (i.e. $V_2$–$V_1$).

If the measured $V_{BATT}$ is higher than the desired PA supply voltage $V_1$ plus the preset headroom (e.g. 0.6 V), the bypass switch BPSW1 is activated to connect the battery voltage directly to the output node C and the Buck SMPS 3, step 46.

If the measured $V_{BATT}$ is lower than the desired PA supply voltage $V_1$ plus the preset headroom (e.g. 0.6 V), the value of the boost voltage $V_2$ is set to be slightly higher than the desired PA supply voltage $V_1$ plus the preset headroom (e.g. 0.6 V) by means of the boost voltage control signal applied to the comparator 25, step 47.

In step 48, it is checked whether the modulation method is GMSK (in the GSM mode) or WCDMA. If the modulation method is WCDMA, the Boost SMPS 2 is set to the second section mode (boost switches BHSW2 and BLSW2 are selected), step 49.

If the modulation method is GSMK in step 48, it is then checked whether the high band PA 4 or the low band PA 5 is used, step 50. If the low band PA 5 is used, the Boost SMPS 2 is set to the first section mode (all boost switches are selected) by means of the boost section select signal, step 51. If the high band PA 4 is used, the Boost SMPS 2 is set to the second section mode (boost switches BHSW1 and BLSW1 are selected), step 52.

Control of the Buck SMPS 3

Figure 5:
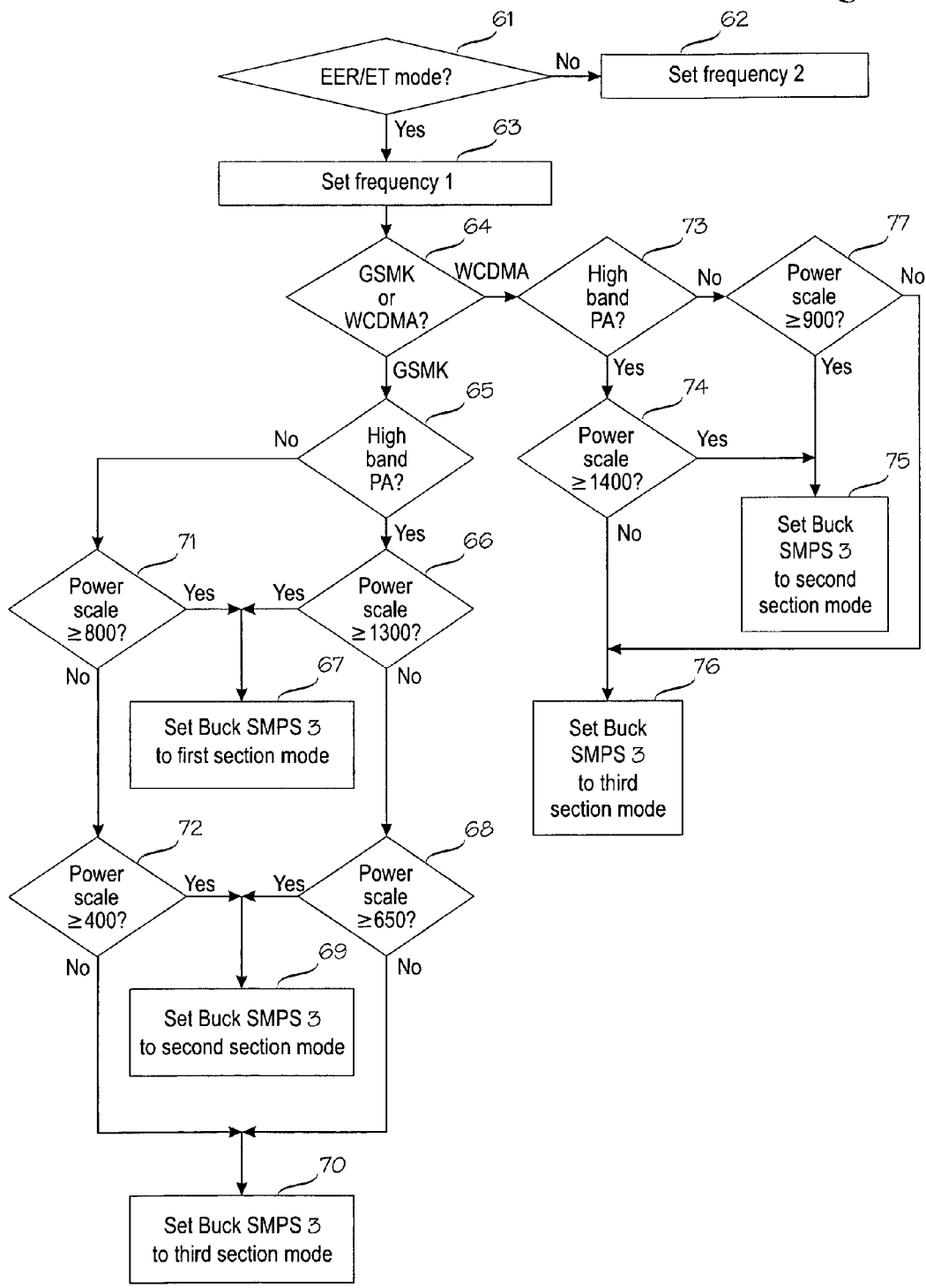
FIG. 5 is a flow diagram illustrating an example of a control algorithm for controlling a buck-type switched-mode power supply in accordance with an embodiment of the invention.

Referring to FIG. 5, it is first checked whether the transmitter operates in the EER or ET mode in step 61. If the transmitter operates in the EER or ET mode, the buck switching frequency is set to a frequency 1 (e.g. 11 MHz) by means of the buck frequency control signal applied to the generator 32, step 63. In an embodiment of the invention, different buck switching frequencies 1 and 1' may be set for EER and ET, respectively. A lower frequency 1' may be used in the ET mode because it is more linear than EER. However, fast envelope tracking is easier achieved with a higher switching frequency, such as that used for EER. If the transmitter does not operate in the EER or ET mode, it is assumed that the PA is operating in a substantially linear mode (such the PT mode) and the buck switching frequency is set to a frequency 2 (e.g. 6 MHz) in step 62.

In step 64, it is checked whether the modulation method is GSMK or WCDMA. If the modulation method is GMSK, it checked whether the high band PA 4 or the low band PA 5 is used, step 65.

If the high band PA 4 is used, it is checked whether the selected power scale is equal to or higher than 1300, step 66. This corresponds to the PA supply voltage $V_1$ having a value of approximately (1300*4.7V/2048=) 3V. If the power scale is equal to or higher than 1300, the Buck SMPS 3 is set to the first section mode (all buck switches are selected) by means of the buck section select signal, step 67.

If the power scale is lower than 1300, it is checked whether the selected power scale is equal to or higher than 650, step 68. This corresponds to the PA supply voltage $V_1$ having a value of approximately (650*4.7V/2048=) 1.5V. If the power scale is equal to or higher than 650, the Buck SMPS 3 is set to the second section mode (the switches BUHSW1 and BULSW1 are selected), step 69.

If the power scale is lower than 650, the Buck SMPS 3 is set to the third section mode (the switches BUHSW2 and BULSW2 are selected), step 70.

If it is determined in step 55 that the low band PA 5 is used, it is checked whether the selected power scale is equal to or higher than 800, step 71. This corresponds to the PA supply voltage $V_1$ having a value of approximately (800*4.7V/2048=) 1.8V. If the power scale is equal to or higher than 800, the Buck SMPS 3 is set to the first section mode (all buck switches are selected) by means of the buck section select signal, step 67

If the power scale is lower than 800, it checked whether the selected power scale is equal to or higher than 400, step 72. This corresponds to the PA supply voltage $V_1$ having a value of approximately (400*4.7V/2048=) 0.9V. If the power scale is equal to or higher than 400, the Buck SMPS 3 is set to the second section mode (the switches BUHSW1 and BULSW1 are selected), step 69.

If the power scale is lower than 400, the Buck SMPS 3 is set to the third section mode (the switches BUHSW2 and BULSW2 are selected), step 70.

If it is determined in step 64 that the modulation method is WCDMA, it is checked whether the high band PA 4 or the low band PA 5 is used, step 73.

If the high band PA 4 is used, it is checked whether the selected power scale is equal to or higher than 1400, step 74. This corresponds to the PA supply voltage $V_1$ having a value of approximately (1400*4.7V/2048=) 3.2V. If the power scale is equal to or higher than 1400, the Buck SMPS 3 is set to the second section mode (the switches BUHSW1 and BULSW1 are selected) by means of the buck section select signal, step 75.

If it is determined in step 63 that the low band PA 5 is used, it is checked whether the selected power scale is equal to or higher than 900, step 77. This corresponds to the PA supply voltage $V_1$ having a value of approximately (900*4.7V/2048=) 2.0V. If the power scale is equal to or higher than 900, the Buck SMPS 3 is set to the second section mode (the switches BUHSW1 and BULSW1 are selected) by means of the buck section select signal, step 75.

If the power scale is lower than 900, the Buck SMPS 3 is set to the third section mode (the switches BUHSW2 and BULSW2 are selected), step 76.

It should be appreciated that the threshold values for mode selection switching are presented above as illustrative examples only and they may change, depending on the switched-mode power supplies SMPS and the RF power amplifiers PA used in each particular transmitter, for example. RF power amplifiers of different manufacturers may typically have different currents and collector voltages. The used threshold values may be stored in a table format in the communication device. The threshold value tables may be created by measuring several power amplifiers from different manufacturers and comparing the voltage/current curves with the measured SMPS efficiency curves, or the tables may be individually tuned in production by searching the optimum switchover points (lowest battery current at that output voltage).

It should also be appreciated that the exemplary control algorithms described with respect to FIGS. 4 and 5 are intended only to illustrate the present invention, and that various different control algorithms can be applied without departing from the scope of the present invention.

Control functions according to various embodiments of the present invention may be implemented by various means. For example, these functions, or the control unit 8, may be implemented in hardware (one or more devices), firmware (one or more devices), software (one or more modules), or combinations thereof. For a hardware implementation, the processing units used for channel estimation may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, implementation can be through modules (e.g., procedures, functions) that perform the functions described herein. The software codes may be stored in a memory unit and executed by the processors. The memory unit may be implemented within the processor or external to the processor, in which case it can be communicatively coupled to the processor via various means as is known in the art. Additionally, components of the systems described herein may be rearranged and/or complemented by additional components in order to facilitate achieving the various aspects, goals, advantages, etc., described herein, and are not limited to the precise configurations set forth in a given figure, as will be appreciated by one skilled in the art.

According to some embodiments of the invention, the control unit 8 may be a transmitter control unit 8 or a control unit controlling the whole operation of a wireless communication device, such as a cellular telephone.

Boost-type and Buck-type switched-mode power supplies, power amplifiers, and transmitters according to embodiments of the invention may be implemented with discrete electronic components, with one or more circuit chips, or with any combination of discrete components and one or more integrated chips. Integrated chips may use any suitable integrated circuit manufacturing technology, including bipolar, CMOS, and BiCMOS technologies.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments described herein but is to be accorded the widest scope consistent with the principles and novel features disclosed herein.

The invention claimed is:

1. A method, comprising:
   measuring a battery voltage inputted to a cascade connection of a boost-type switched-mode power supply and a buck-type switched-mode power supply providing a supply voltage to a radio frequency power amplifier, wherein at least one of the buck-type switched-mode power supply and the boost-type switched-mode power supply comprises at least two section modes having at least two parallel switches such that in a first one of the section modes both of the two parallel switches are switched on and off at the switching frequency to provide a maximum load current to the radio frequency power amplifier, and in a second one of the section modes a first one of the parallel switches is switched on and off at the switching frequency;
   comparing the measured battery voltage with a threshold corresponding to an input supply voltage which is needed for the buck-type switched-mode power supply;
   bypassing the boost-type switched-mode power supply and coupling the battery voltage directly to the buck-type switched-mode power supply, if the measured battery voltage exceeds the needed input supply voltage;

controlling the boost-type switched-mode power supply to raise the battery voltage to at least the needed input supply voltage, if the measured battery voltage is below the needed input supply voltage; and controlling the buck-type switched-mode power supply to operate in one of at least two section modes according to one or more of the following: a mode of operation of the power amplifier, a frequency band of the power amplifier, a modulation method, and a transmission power of the power amplifier.

2. The method as claimed in claim 1, further comprising controlling the buck-type switched-mode power supply to operate at one of at least two switching frequencies according to one or more of the following: a mode of operation of the power amplifier, a frequency band of the power amplifier, a modulation method, and a transmission power of the power amplifier.

3. The method as claimed in claim 1, further comprising controlling the boost-type switched-mode power supply to operate at one of at least two switching frequencies according to one or more of the following: a mode of operation of the power amplifier, a frequency band of the power amplifier, a modulation method, and a transmission power of the power amplifier.

4. The method as claimed in claim 1, further comprising controlling the boost-type switched-mode power supply to operate in one of at least two section modes according to one or more of the following: a mode of operation of the power amplifier, a frequency band of the power amplifier, a modulation method, and a transmission power of the power amplifier.

5. The method as claimed in claim 1, further comprising controlling the boost-type switched-mode power supply or the buck-type switched-mode power supply to operate in a dithering mode where the switching frequency is changed randomly from cycle to cycle.

6. A computer program embodied on a non-transitory computer readable medium, the computer program comprising a program code for controlling a processor to execute a routine comprising:

measuring a battery voltage inputted to a cascade connection of a boost-type switched-mode power supply and a buck-type switched-mode power supply providing a supply voltage to a radio frequency power amplifier, wherein at least one of the buck-type switched-mode power supply and the boost-type switched-mode power supply comprises at least two section modes having at least two parallel switches such that in a first one of the section modes both of the two parallel switches are switched on and off at the switching frequency to provide a maximum load current to the radio frequency power amplifier, and in a second one of the section modes a first one of the parallel switches is switched on and off at the switching frequency;

comparing the measured battery voltage with a threshold corresponding to an input supply voltage which is needed for the buck-type switched-mode power supply;

bypassing the boost-type switched-mode power supply and coupling the battery voltage directly to the buck-type switched-mode power supply, if the measured battery voltage exceeds the needed input supply voltage;

controlling the boost-type switched-mode power supply to raise the battery voltage to at least the needed input supply voltage, if the measured battery voltage is below the needed input supply voltage; and controlling the buck-type switched-mode power supply to operate in one of at least two section modes according to one or more of the following: a mode of operation of the power amplifier, a frequency band of the power amplifier, a modulation method, and a transmission power of the power amplifier.

7. An apparatus, comprising:

at least one radio frequency power amplifier;

a boost-type switched-mode power supply having an input for a battery voltage from a battery;

a buck-type switched-mode power supply connected in cascade with the boost-type switched-mode power supply and having a supply voltage output for the radio frequency power amplifier;

a bypass switch controllable to bypass the boost-type switched-mode power supply and to couple the battery voltage directly to the buck-type switched-mode power supply, if the battery voltage exceeds a threshold corresponding to an input supply voltage which is needed for the buck-type switched-mode power supply;

the boost-type switched-mode power supply being controllable to raise the battery voltage to at least the needed input supply voltage, if the battery voltage is below the threshold; and the buck-type switched-mode power supply comprising at least two section modes selectable according to one or more of the following: a mode of operation of the power amplifier, a frequency band of the power amplifier, a modulation method, and a transmission power of the power amplifier, wherein at least one of the buck-type switched-mode power supply and the boost-type switched-mode power supply comprises at least two section modes having at least two parallel switches such that in a first one of the section modes both of the two parallel switches are switched on and off at the switching frequency to provide a maximum load current to the at least one power amplifier, and in a second one of the section modes a first one of the parallel switches is switched on and off at the switching frequency.

8. The apparatus as claimed in claim 7, wherein at least one of the buck-type switched-mode power supply and the boost-type switched-mode power supply is controllable to operate at one of at least two switching frequencies according to one or more of the following: a mode of operation of the power amplifier, a frequency band of the power amplifier, a modulation method, and a transmission power of the power amplifier.

9. The apparatus as claimed in claim 7, wherein the boost-type switched-mode power supply is controllable to operate in one of at least two section modes according to one or more of the following: a mode of operation of the power amplifier, a frequency band of the power amplifier, a modulation method, and a transmission power of the power amplifier.

10. The apparatus as claimed in claim 7, wherein at least one of the buck-type switched-mode power supply and the boost-type switched-mode power supply is controllable to operate in a dithering mode where the switching frequency is changed randomly from cycle to cycle.

11. The apparatus as claimed in claim 7, wherein in a third one of the section modes a second one of the two parallel switches is switched on and off at the switching frequency.

12. The apparatus as claimed in claim 7, wherein the two parallel switches are sized for different load currents.

13. The apparatus as claimed in claim 7, wherein said at least one power amplifier comprises a first radio frequency power amplifier for a first transmission frequency band and a second radio frequency amplifier for a second transmission frequency band, the first transmission frequency band being lower in a frequency domain than the second transmission frequency band.

14. The apparatus as claimed in claim 13, wherein the first radio frequency band is located at approximately 900 MHz in the frequency domain, and the second radio frequency band is located at approximately 1800 MHz or 1900 MHz in the frequency domain.

15. The apparatus as claimed in claim 13, wherein the buck-type switched-mode power supply comprises at least two section modes having at least two parallel switches such that in a first one of the section modes both of the two parallel switches are switched on and off at the switching frequency to provide a maximum load current, and in a second one of the section modes a first one of the parallel switches is switched on and off at the switching frequency, and wherein the buck-type power supply is controllable to operate in the first section mode, when a first modulation and the first power amplifier are used and a required power reaches a first power threshold, or when the first modulation and the second power amplifier are used and the required power reaches a second power threshold.

16. The apparatus as claimed in claim 15, wherein the buck-type power supply is controllable to operate in the second section mode, when the first modulation and the first power amplifier are used and the needed power is lower than the first power threshold but above a third power threshold, or when the first modulation and the second power amplifier are used and the needed power is lower than the second power threshold but above a fourth power threshold.

17. The apparatus as claimed in claim 16, wherein the buck-type switched-mode power supply comprises a third section mode in which a second one of the two parallel switches is switched on and off at the switching frequency, and wherein the buck-type power supply is controllable to operate in the third section mode, when the first modulation and the first power amplifier are used and the needed power is lower than the third power threshold, or when the second power amplifier is used and the needed power is lower than the fourth power threshold.

18. The apparatus as claimed in claim 15, wherein the power thresholds are different for different modulation methods and/or different power amplifiers.

19. The apparatus as claimed in claim 15, wherein the first modulation is a GMSK modulation.

20. The apparatus as claimed in claim 15, wherein the buck-type power supply is controllable to operate in the second section mode, when a second modulation and the first power amplifier are used and the needed power reaches a fifth power threshold, or when the second modulation and the second power amplifier are used and the needed power reaches a sixth power threshold, and wherein the buck-type power supply is controllable to operate in the third section mode, when the second modulation and the first power amplifier are used and the needed power is lower than the fifth power threshold, or when the second modulation and the second power amplifier are used and the needed power is lower than the sixth power threshold.

21. The apparatus as claimed in claim 20, wherein the second modulation is WCDMA.

22. The apparatus as claimed in claim 7, wherein the boost-type switched-mode power supply comprises at least two section modes having at least two parallel switches such that in a first one of the section modes both of the two parallel switches are switched on and off at the switching frequency to provide a maximum load current, and in a second one of the section modes a first one of the parallel switches is switched on and off at the switching frequency, and wherein the boost-type power supply is controllable to operate in the first section mode when a first modulation is used, and in the second section mode when a second modulation is used.

23. The apparatus as claimed in claim 7, wherein the boost-type switched-mode power supply comprises at least two section modes having at least two parallel switches such that in a first one of the section modes both of the two parallel switches are switched on and off at the switching frequency to provide a maximum load current, and in a second one of the section modes a first one of the parallel switches is switched on and off at the switching frequency, and wherein the boost-type power supply is controllable to operate in the first section mode when a first modulation and a first frequency band are used, and in the second section mode when the first modulation and a second frequency band are used.

24. The apparatus as claimed in claim 23, wherein the boost-type switched-mode power supply comprises a third section mode in which a second one of the two parallel switches is switched on and off at the switching frequency, and wherein the boost-type power supply is controllable to operate in the third section mode, when a second modulation is used.

25. The apparatus as claimed in claim 23, wherein the first modulation is GSMK.

26. The apparatus as claimed in claim 24, wherein the second modulation is WCDMA.

27. The apparatus as claimed in claim 7, wherein the buck-type switched-mode power supply or the boost-type switched-mode power supply is controllable to operate at a higher switching frequency, when the power amplifier operates in an envelope elimination and restoration mode or in an envelope tracking mode, and to operate at a lower switching frequency, when the power amplifier operates in a power-level tracking mode.

28. The apparatus as claimed in claim 27, wherein the switching frequencies are different for the boost-type switched-mode power supply and the buck-type switched-mode power supply.

29. The apparatus as claimed in claim 7, wherein the switches comprise a field effect transistor whose current capability is determined by a channel width.

30. The apparatus as claimed in claim 7, wherein one or more of the boost switches of the boost-type switched-mode power supply are configured to provide a parallel current path from the battery to the buck-type switched-mode power supply, when the bypass switch is controlled to bypass the boost-type switched-mode power supply.

31. The apparatus as claimed in claim 7, wherein the boost-type switched-mode power supply, the buck-type switched-mode power supply and the power amplifier are implemented with discrete electronic components, with one or more circuit chips, or with any combination of discrete electronic components and one or more integrated chips.

32. The apparatus as claimed in claim 7, comprising a controller for controlling the boost-type switched-mode power supply and the buck-type switched-mode power supply.

33. The apparatus as claimed in claim 32, wherein the controller is implemented in hardware, firmware, or in combinations thereof with software.

34. The apparatus as claimed in claim 7, wherein the apparatus is implemented in a radio frequency transmitter.

35. The apparatus as claimed in claim 7, wherein the apparatus is implemented in a wireless communication device.

36. A method, comprising:
providing a cascade connection of a boost-type switched-mode power supply and a buck-type switched-mode power supply to provide a supply voltage to a radio frequency power amplifier from a battery voltage, wherein at least one of the buck-type switched-mode power supply and the boost-type switched-mode power supply comprises at least two section modes having at least two parallel switches such that in a first one of the section modes both of the two parallel switches are switched on and off at the switching frequency to provide a maximum load current to the radio frequency power amplifier, and in a second one of the section modes a first one of the parallel switches is switched on and off at the switching frequency;
controlling the boost-type switched-mode power supply to raise the battery voltage to at least an input supply voltage which is needed for the buck-type switched-mode power supply; and
controlling the buck-type switched-mode power supply to operate in one of at least two section modes according to one or more of the following: a mode of operation of the power amplifier, a frequency band of the power amplifier, a modulation method, and a transmission power of the power amplifier.

37. The method as claimed in claim 36, further comprising controlling the buck-type switched-mode power supply to operate at one of at least two switching frequencies according to one or more of the following: a mode of operation of the power amplifier, a frequency band of the power amplifier, a modulation method, and a transmission power of the power amplifier.

38. The method as claimed in claim 36, further comprising controlling the boost-type switched-mode power supply to operate at one of at least two switching frequencies according to one or more of the following: a mode of operation of the power amplifier, a frequency band of the power amplifier, a modulation method, and a transmission power of the power amplifier.

39. The method as claimed in claim 36, further comprising controlling the boost-type switched-mode power supply to operate in one of at least two section modes according to one or more of the following: a mode of operation of the power amplifier, a frequency band of the power amplifier, a modulation method, and a transmission power of the power amplifier.

40. A method, comprising:
providing a cascade connection of a boost-type switched-mode power supply and a buck-type switched-mode power supply to provide a supply voltage to a radio frequency power amplifier from a battery voltage, wherein at least one of the buck-type switched-mode power supply and the boost-type switched-mode power supply comprises at least two section modes having at least two parallel switches such that in a first one of the section modes both of the two parallel switches are switched on and off at the switching frequency to provide a maximum load current to the radio frequency power amplifier, and in a second one of the section modes a first one of the parallel switches is switched on and off at the switching frequency;
controlling the boost-type switched-mode power supply to raise the battery voltage to at least an input supply voltage which is needed for the buck-type switched-mode power supply; and
controlling the buck-type switched-mode power supply to operate at a higher switching frequency, when the power amplifier operates in an envelope elimination and restoration mode or in an envelope tracking mode, and to operate at a lower switching frequency, when the power amplifier operates in a linear mode.

41. The method as claimed in claim 40, wherein the switching frequency used for the envelope tracking is the same as or lower than the switching frequency used for the envelope elimination and restoration but higher than the switching frequency used for the linear mode.

42. The method as claimed in claim 41, wherein the linear mode comprises a power-level tracking mode.

43. A computer program embodied on a non-transitory computer readable medium, the computer program comprising a program code for controlling a processor to execute a routine comprising:
providing a cascade connection of a boost-type switched-mode power supply and a buck-type switched-mode power supply to provide a supply voltage to a radio frequency power amplifier from a battery voltage, wherein at least one of the buck-type switched-mode power supply and the boost-type switched-mode power supply comprises at least two section modes having at least two parallel switches such that in a first one of the section modes both of the two parallel switches are switched on and off at the switching frequency to provide a maximum load current to the radio frequency power amplifier, and in a second one of the section modes a first one of the parallel switches is switched on and off at the switching frequency;
controlling the boost-type switched-mode power supply to raise the battery voltage to at least an input supply voltage which is needed for the buck-type switched-mode power supply; and
controlling the buck-type switched-mode power supply to operate in one of at least two section modes according to one or more of the following: a mode of operation of the power amplifier, a frequency band of the power amplifier, a modulation method, and a transmission power of the power amplifier.

44. A controller comprising:
means for measuring a battery voltage inputted to a cascade connection of a boost-type switched-mode power supply and a buck-type switched-mode power supply providing a supply voltage to a radio frequency power amplifier, wherein at least one of the buck-type switched-mode power supply and the boost-type switched-mode power supply comprises at least two section modes having at least two parallel switches such that in a first one of the section modes both of the two parallel switches are switched on and off at the switching frequency to provide a maximum load current to the radio frequency power amplifier, and in a second one of the section modes a first one of the parallel switches is switched on and off at the switching frequency;
means for comparing the measured battery voltage with a threshold corresponding to an input supply voltage which is needed for the buck-type switched-mode power supply;
means for bypassing the boost-type switched-mode power supply and coupling the battery voltage directly to the buck-type switched-mode power supply, if the measured battery voltage exceeds the needed input supply voltage;
means for controlling the boost-type switched-mode power supply to raise the battery voltage to at least the needed input supply voltage, if the measured battery voltage is below the needed input supply voltage; and means for controlling the buck-type switched-mode power supply to operate in one of at least two section modes according to one or more of the following: a mode of operation of the power amplifier, a frequency band of the power amplifier, a modulation method, and a transmission power of the power amplifier.

45. The controller as claimed in claim 44, wherein each of said means is implemented in hardware, firmware, or in combinations thereof with software.

46. A computer program embodied on a non-transitory computer readable medium, the computer program comprising a program code for controlling a processor to execute a routine comprising:

providing a cascade connection of a boost-type switched-mode power supply and a buck-type switched-mode power supply to provide a supply voltage to a radio frequency power amplifier from a battery voltage, wherein at least one of the buck-type switched-mode power supply and the boost-type switched-mode power supply comprises at least two section modes having at least two parallel switches such that in a first one of the section modes both of the two parallel switches are switched on and off at the switching frequency to provide a maximum load current to the radio frequency power amplifier, and in a second one of the section modes a first one of the parallel switches is switched on and off at the switching frequency;

controlling the boost-type switched-mode power supply to raise the battery voltage to at least an input supply voltage which is needed for the buck-type switched-mode power supply; and controlling the buck-type switched-mode power supply to operate at a higher switching frequency, when the power amplifier operates in an envelope elimination and restoration mode or in an envelope tracking mode, and to operate at a lower switching frequency, when the power amplifier operates in a linear mode.

47. A controller comprising:

means for providing a cascade connection of a boost-type switched-mode power supply and a buck-type switched-mode power supply to provide a supply voltage to a radio frequency power amplifier from a battery voltage, wherein at least one of the buck-type switched-mode power supply and the boost-type switched-mode power supply comprises at least two section modes having at least two parallel switches such that in a first one of the section modes both of the two parallel switches are switched on and off at the switching frequency to provide a maximum load current to the radio frequency power amplifier, and in a second one of the section modes a first one of the parallel switches is switched on and off at the switching frequency;

means for controlling the boost-type switched-mode power supply to raise the battery voltage to at least an input supply voltage which is needed for the buck-type switched-mode power supply; and means for controlling the buck-type switched-mode power supply to operate at a higher switching frequency, when the power amplifier operates in an envelope elimination and restoration mode or in an envelope tracking mode, and to operate at a lower switching frequency, when the power amplifier operates in a linear mode.

48. The controller as claimed in claim 47, wherein each of said means is implemented in hardware, firmware, or in combinations thereof with software.

* * * * *